United States Patent [19]
Shields et al.

[11] 3,778,886
[45] Dec. 18, 1973

[54] SEMICONDUCTOR STRUCTURE WITH FUSIBLE LINK AND METHOD

[75] Inventors: Michael A. Shields, Sunnyvale; Robert W. Andrews, San Jose, both of Calif.

[73] Assignee: Signetics Corporation, Sunnyvale, Calif.

[22] Filed: Jan. 20, 1972

[21] Appl. No.: 219,579

Related U.S. Application Data

[62] Division of Ser. No. 33,802, May 1, 1970.

[52] U.S. Cl. .................................... 29/577, 29/584
[51] Int. Cl. ............................................ B01j 17/00
[58] Field of Search ....................... 29/577, 584, 574

[56] References Cited

UNITED STATES PATENTS 3,564,354 2/1971 Aoki ................................. 317/235
3,303,400 2/1967 Allison ............................... 317/235
3,484,341 12/1969 Devitt ................................. 204/15

*Primary Examiner*—Charles W. Lanham
*Assistant Examiner*—Wilbur C. Tupman
*Attorney*—Flehr et al.

[57] ABSTRACT

A semiconductor structure with a fusible link having a semiconductor body with semiconductor devices formed in the semiconductor body and a lead structure carried by the body making contact with the devices formed in the body to form an array in which the lead structure includes at least one fusible link which lies in a single plane and which has a relatively precise thickness and length throughout.

4 Claims, 20 Drawing Figures

SEMICONDUCTOR STRUCTURE WITH FUSIBLE LINK AND METHOD

This is a division, of application Ser. No. 33,802 filed May 1, 1970.

BACKGROUND OF THE INVENTION

Semiconductor structure with fusible links have heretofore been provided. In one embodiment of the invention, fusible links were routed over small bumps to thin out the fusible link so that it would blow at less than 500 milliamperes. In another embodiment, the fusible links were passed over bumps of photoresist and thereafter the photoresist was etched away so that the link was suspended in air and thereby removing the heat sinking effect of the substrate. In addition, attempts have been made to provide fusible links with notches to narrow down the lead. All of these approaches have difficulty in the fact that the same metallization is utilized for both the fusible link and the bus bars. The bridging approach utilizing photoresist has involved difficulties because there may be photoresist residue left on the semiconductor wafer which could cause the metallization to lift in undesired places. This has caused the fusing current to vary widely from one run to another and for individual devices so that they do not have the desired reliability. There is, therefore, a need for a new and improved semiconductor structure with fusible link and a method for making the same.

SUMMARY OF THE INVENTION AND OBJECTS

The semiconductor structure consists of a semiconductor body. Semiconductor devices are formed in the semiconductor body and a lead structure is carried by the body and makes contact with the semiconductor devices to form an array. The lead structure includes at least one fusible link which lies in a single plane and which has substantially uhiform thickness and a substantially uniform width throughout its length. The dimensions of the fusible link are relatively precise so that it can be fused with a relatively precise current level flowing through the same which is insufficient to harm the semiconductor device.

In general, it is an object of the present invention to provide a semiconductor structure with fusible link and method in which the fusing current has great repeatability from run to run and from one individual structure to another.

Another object of the invention is to provide a structure and method of the above character in which a separate evaporation is utilized for making the fusible link.

Another object of the invention is to provide a structure and method of the above character in which great care is taken to ensure a uniform thickness and width for the fuse metal.

Another object of the invention is to provide a structure and method of the above character which can be utilized with either single level or double level metallization.

Another object of the invention is to provide a structure and method of the above character which can be utilized in conjunction with relatively complicated integrated circuits such as read only memories.

Additional objects and features of the invention will appear from the following description in which the preferred embodiment is set forth in detail in conjunction with the accompanying drawing.

DESCRIPTION OF THE PREFERRED EMBODIMENTS

Figure 1:
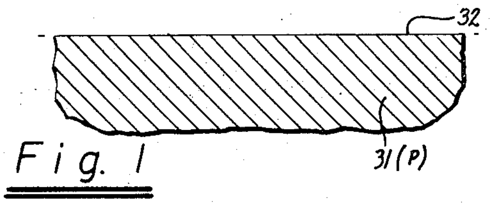
FIGS. 1 – 11 are cross-sectional views showing the steps utilized for the fabrication of a semiconductor structure with a single layer of interconnect metallization.
Figure 2:
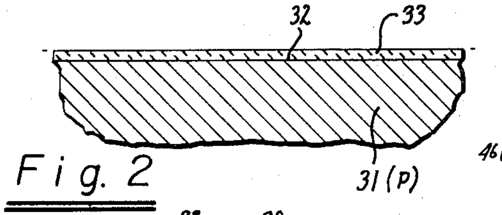
Figure 3:
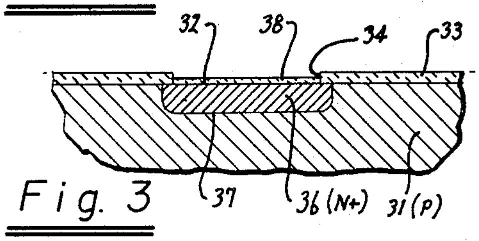
Figure 4:
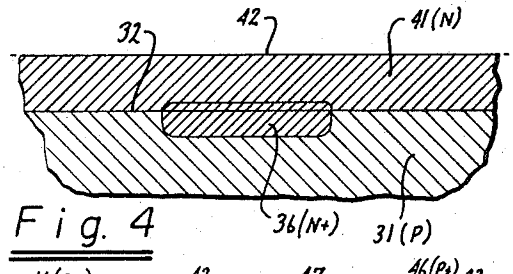
Figure 5:
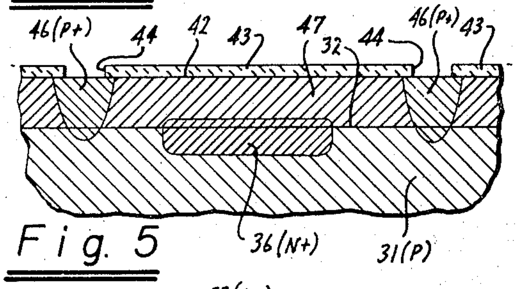
Figure 6:
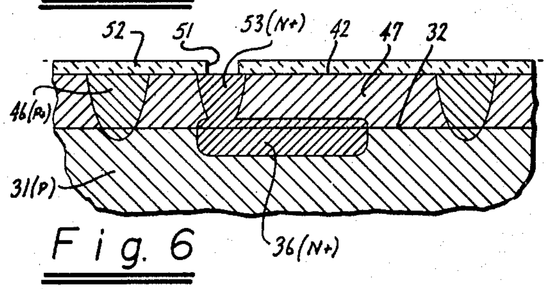
Figures 7, 8, 9, 10, 11:
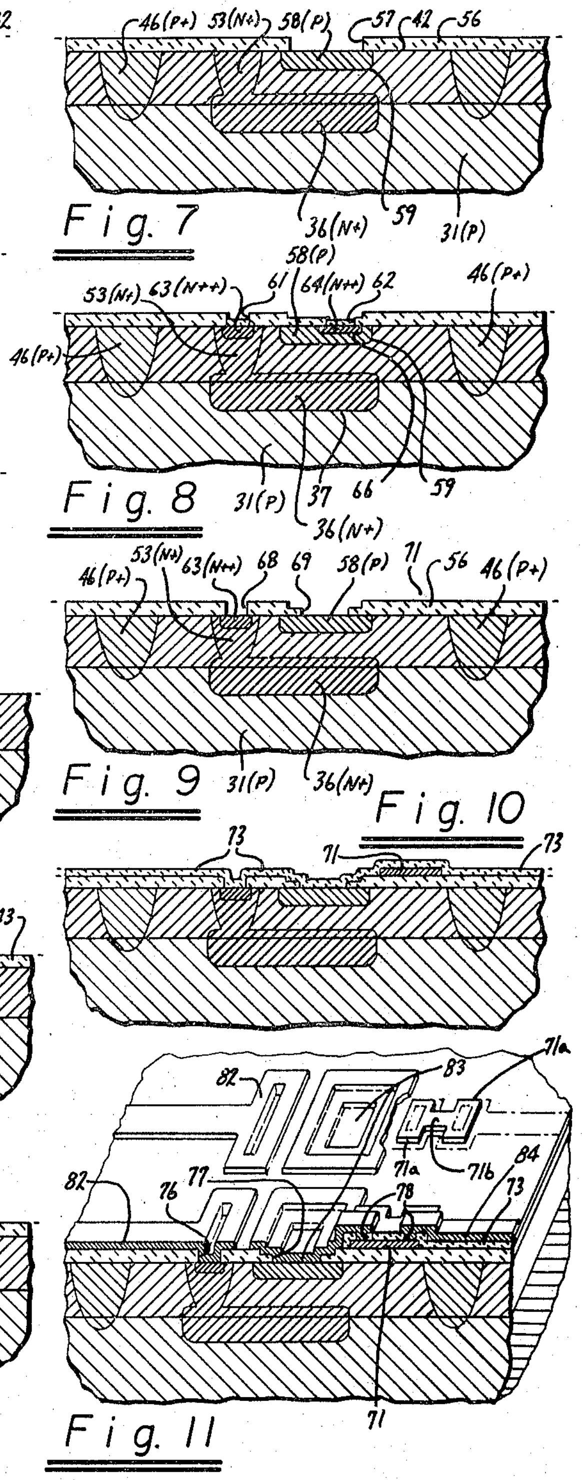

In the embodiment of the invention shown in FIGS. 1 through 11, there is disclosed a semiconductor structure with fusible link and method which makes use of one layer of interconnect metal. In fabricating the semiconductor structure, there are a number of steps required as shown in FIGS. 1 through 11. A semiconductor body 31 formed of a suitable semiconductor material is utilized. Typically, such a semiconductor body can have either a p-type or n-type impurity depending upon the type of semiconductor structure desired and having resistivity from 8 to 16 ohm centimeters. The semiconductor body is provided with a generally planar surface 32. A layer 33 of insulating material is formed on the surface 32. Typically, if the semiconductor body 31 is formed of silicon, the layer 33 can be formed of silicon dioxide ($SiO_2$) which can be formed in any number of conventional ways. An opening 34 is formed in the layer 33 by the use of conventional photolithographic techniques. For example, a layer of photoresist can be placed on the surface of the layer 33. The photoresist can then be exposed through a suitable mask to provide the desired pattern and thereafter the photoresist is developed so that there remains a mask having openings therein. A suitable etch is then provided which selectively etches the oxide to form the openings 34 which expose the surface 32. An impurity is then diffused through the openings 34. For example, an n-type impurity such as arsenic may be diffused through the openings 34 to provide regions 36 formed in the body 31 and to form p-n junctions 37 which are substantially dish-shaped and extend to the surface 32 beneath the oxide layer 33. During the diffusion of the impurity to form the diffused regions 36, additional thin oxide layers 38 grow in the openings 34.

After the n+ region 36 has been formed, the oxide layer 33 and the thin oxide layer 38 are removed by the use of a suitable etch. A layer 41 is then grown on the surface 32. This layer 41 also can be grown in a conventional manner such as by epitaxial techniques. Thus as shown, an n-type layer 41 has been grown over the p-type semiconductor body 31. During the time that this is occurring, the n+ region 36 will diffuse upwardly to some degree into the epitaxial layer 41 as shown particularly in FIG. 4. This layer 41 can have a resistivity ranging from 0.2 to 1.0 ohm centimeters depending upon the breakdown requirements of the semiconductor structure. The thickness of the layer 41 typically can be approximately 10 microns. The layer 41 has a surface 42. A layer 43 which can serve as a mask as hereinafter described is provided on the surface 42. Typically this can be a layer of silicon dioxide if the semiconductor body 31 is formed of silicon. Openings 44 are formed in the layer 43 by conventional photolithographic techniques hereinbefore described. p+ isolation post regions 46 are formed by diffusing a particular impurity such as boron through the openings 44. As can be seen, the regions 46 are diffused to a depth so that they extend completely through the layer 41 and into the p-type semiconductor body 31 so that the posts 46 form isolated regions 47 in the semiconductor structure.

After the isolated regions 47 have been formed, collector plugs or regions 53 are formed in the isolated regions by forming openings 51 in a layer 52 of insulating material overlying the surface 42. The layer 52 can be formed by stripping off the previous layer 43 and regrowing the oxide layer 52 in a conventional manner. Alternatively, if desired, the oxide layer 43 may be left in place and the openings 51 may be formed in the same. After the openings 51 have been formed, a suitable n-type impurity such as phosphorus is diffused through the openings 51 to provide deep diffused n+ regions 53 which are diffused through the surface 42 and through the isolation regions 47 to make contact with the buried layers in the form of the n+ regions 36.

After this has been completed, the oxide layer 52 is stripped off of the surface 42 and the semiconductor body in the form of a wafer is re-oxidized in a conventional manner to form a silicon dioxide layer 56 of a suitable thickness such as .7 to .8 microns. Openings 57 are then formed in the oxide layer 56 in the conventional manner and a p-type impurity such as boron is diffused through the same to provide base regions 58 which are defined by dish-shaped junctions 59 which extend to the surface 42. Openings 61 and 62 are then formed in the oxide layer 52 in a conventional manner and n-type material is diffused through these openings so that there is provided *n*++ regions 63 which extend into the n+ collector regions 53 to provide a good low resistance contact to the collector. Similarly, *n*++ regions 64 are formed within the base region 58 to form emitter regions that are defined by dish-shaped p-n junctions 66 which extend to the surface 42.

In this manner, transistors are formed. However, if it is desired to only form diodes in the isolated regions 47, the diffused emitter regions 64 can be omitted. In any event, it can be seen that conventional planar technology is utilized in forming diodes or transistors. In the figures which follow, it will be assumed that it is only desired to produce diodes in the isolated regions 47. Openings 68 and 69 are then formed in the oxide layer 56 overlying the *n*++ regions 63 and the *p* region 58. It can be seen that the process thus far described is conventional and that the openings 68 and 69 have been provided for making the standard contacts.

In order to form the fuse links of the present invention, a fuse-type metal is evaporated through a mask to provide a discrete fuse element 71 formed by a metal layer of a suitable material such as aluminum on the oxide layer 56. Other metals such as chromium and michrome can be used where a lower frequency current is desired. The metal in use can be of any thickness up to 2000 A° depending upon the desired fusing current. The fusing current is also determined by the width of the fuse and, therefore, the width of the fuse element 71 also must be precisely controlled. It should be noted that the fuse element 71 is evaporated over a portion of the insulating layer 56 which is relatively planar and does not have any steps or other sharp variations in the surface. This is to ensure that the fuse element 71 is of a uniform thickness throughout its length. Each fuse element 71 is provided with contact portions 71*a* and a fuse portion 71*b*. The fuse portion 71*b* serves as a fusible link and has a uniform precise thickness and width throughout its length. Alternatively, fuse metal can be deposited on the entire surface of the oxide layer 56 to the desired thickness and thereafter by conventional photolithographic techniques, the undesired portions of the metal layer are etched away so that again there are provided fuse elements of the same type having a precise thickness and width.

After the fuse elements 71 have been deposited, a glass layer 73 is deposited over the oxide layer 56 and the metal layer 71. This glass which can be silicon dioxide is deposited in a conventional manner by the reaction of silane, hydrogen and oxygen. Other materials can be utilized if desired; however, the material should not have an expansion rate which is too different from that of the fuse elements 71. This glass layer 73 is deposited to a suitable depth such as 0.6 to 1.0 microns.

After the layer 73 has been deposited, a mask is utilized to provide the necessary contact openings. In etching the openings through the glass layer 73, it is desirable to utilize an etch which selectively attacks the glass but which will not attack the metal, i.e. the aluminum which is used for the fuse metal. Thus, there is provided an opening 76 overlying the n++ region of the collector or, in the case of a diode, the cathode, an opening 77 which overlies the p-type region or the base of the diode and a pair of openings 78 which overlie the contact portions 71a of the fuse elements 71. A metal layer 81 of a suitable material such as aluminum is then evaporated into the openings 76, 77 and 78 and onto the glass layer 73. The undesired metal is removed by conventional photolithographic techniques so that there is provided the lead structure which is shown. Thus, there is provided a cathode lead 82, an anode lead 83 which makes contact to one end of the fuse element 71 by contacting a contact pad portion 71a thereof through the openings 78. The other contact pad portion of the fuse element 71 is engaged by the lead 84. The metallization has a conventional thickness such as approximately 1 micron. With the construction shown, it can be seen that the anode lead 83 goes over the steps in the oxide which were utilized in making the anode so that it is unnecessary for the fuse metallization to be placed over any steps and, therefore, helps to ensure uniformity of the fuse metallization.

Figure 12:
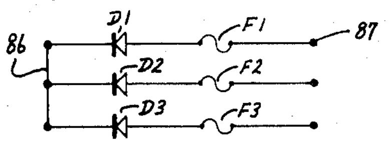
FIG. 12 is a circuit diagram of a typical array incorporating the present invention.

An integrated circuit showing this type of construction is shown in FIG. 12 and, as shown therein, consists of a plurality of diodes which have been identified as D1, D2 and D3 and having their cathodes connected to a common bus bar 86 and having the anodes serially connected to fuses or fuse elements identified as F1, F2 and F3 and which are connected to terminals 87. With this construction, it can be readily seen that an array or matrix of diodes can be provided and that such a matrix and other types of matrices can be provided in an integrated circuit. This present construction makes it possible for a customer purchasing the integrated circuit to obtain the particular configuration desired by blowing or fusing a particular fuse link or by blowing or fusing a plurality of such fuse links.

In general, the metallization which has been laid down for the fuse links or elements 71 has a thickness and width so that it will be fused at a current level which is substantially greater than the normal d.c. operating current as hereinafter described.

By utilization of the foregoing method, it can be seen that the fuse is made of a very thin (less than 2000 A°) metal such as aluminum and that it does not pass over any steps so that it can be substantially uniform throughout. This fuse metallization 71 is protected by the layer of glass 73. The metal for the contacts to the fuse elements and the other parts of the integrated circuit and bus bars is deposited by a step separate from the step for depositing the fuse metal. By constructing the fuse elements in this manner, the fusing current required for fusing or blowing the fuse is dependent only in the width and thickness of the fuse metal. As hereinbefore explained, the fuse metal, even though very thin, can be readily etched to the desired dimensions. Thus, it is readily possible to provide fuse elements ranging in width from 2.5 to 20 microns.

The energy which is required to blow the fuses is proportional to $I^2R$. The fusing current is directly proportional to the fuse width and to the heat sinking effect of the substrate which carries the fuse. When the fuse width increases by two, the heat sinking area increases by two and the fusing current increases by two. The square of the fusing current is directly proportional to the thickness of the metal, i.e. if the thickness increases by two, $I^2$ increases by two.

In order to ensure safe operation of the fuse elements over long periods of time, it is desirable that the ratio of fusing current to the normal continuous operating current be in the vicinity of 50:1 when a metal such as aluminum is used for the fuse links. However, lower ratios of blowing to steady state currents are possible when metals such as chromium and nichrome are used. By utilizing these principles in constructing the semiconductor structure which is shown, an instantaneous current density of approximately $2.2 \times 10^7$ amps/cm.$^2$ ensures that the maximum continuous current density would not exceed $5\times10^5$ amps/cm.$^2$. As is well known to those skilled in the art, it is desirable to avoid usage of a maximum continuous current density which is greater than this amount because aluminum migrates at current densities exceeding this amount. Such electromigration of the aluminum will cause inconsistent results to appear in the blowing or fusing of the fuse elements.

In actual practice of the invention, the anodes are connected by metal bus bars which have very low IR drops. However, since the cathodes are normally interconnected by the heavily doped plugs 46 which can form a single continuous region in a single isolated region 47, there is a relatively large voltage drop in the cathode when the first diode is compared with the last diode of a strip of diodes. To overcome this limitation, dual level metallization can be provided as herein-after described.

In the embodiment of the invention in which dual level metallization is utilized, the steps for making the isolated regions or islands 47 by the use of diffused *p*+ posts is identical to that described in conjunction with FIGS. 1 - 4 of the previous embodiment. The oxide layer 43 is stripped and a new oxide layer 91 is regrown. Conventional photolithographic techniques are utilized to form openings 92 in the oxide layer 91 and to form other openings (not shown) for the resistors in the integrated circuit. a suitable p-type impurity such as boron is diffused through the openings 92 to form base regions 93 which are defined by dish-shaped p-n juctions 94 which extend to the surface. The same is true for the resistors which are not shown.

A thin oxide layer 96 grows in the openings 92 during the base diffusion. Openings 97 are formed in the oxide layer 96 by conventional photolithographic techniques and thereafter an n-type impurity such as phosphorus is diffused through the opening to form n++ emitter regions 98 within the base region 93 and which are defined by dish-shaped junctions 99 which extend to the surface and which are within the p–n junctions 94. At the same time that this diffusion is occurring, *n*+ collector contacts can be diffused into the collector as described in conjunction with the previous embodiment. During the emitter diffusion, a thin oxide layer 101 grows in the opening 97.

After the emitter diffusion, openings 102 for making contact to the emitter and openings 103 for making contact to the base are provided by the use of conventional photolithographic techniques. Contact is also made to the collector region in the same manner as hereinbefore described in the previous embodiment. After the openings 102 and 103 have been formed, the first metallization interconnect layer is provided and a layer of a suitable metal such as aluminum is deposited to a suitable thickness such as 6000 A°. As can be seen, this layer 106 is deposited in the openings 103 and makes contact with the bases and overlies the oxide layer 91. This layer 106 is formed in a conventional manner such as by depositing the metal over the entire surface and then utilizing photolithographic techniques and an etch to remove the undesired metallization.

Figures 13, 14, 15, 16, 17, 18, 19, 20:
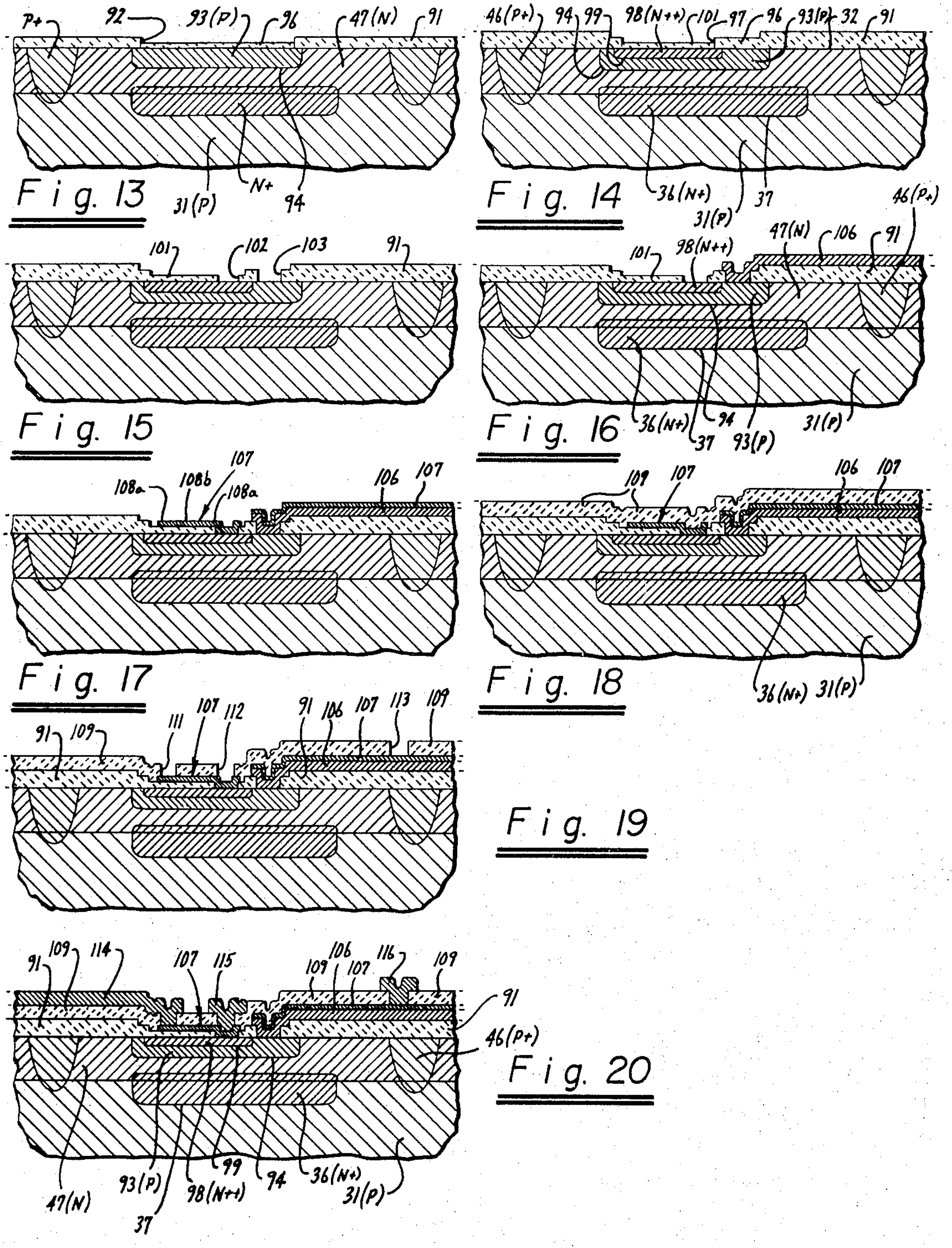
FIGS. 13 – 20 are cross-sectional views showing the steps in forming a semiconductor structure in which dual level interconnect metallization is utilized.

Thereafter, as shown in FIG. 17, an additional layer 107 of metallization is provided in a suitable manner such as by evaporation. This layer is to be utilized for the formation of the fuse elements and, therefore, it is important that it be evaporated in a well controlled manner so that is has a precise thickness. Thereafter, conventional photolithographic techniques are utilized to remove the undesired fuse metal so that the fuse element itself has a precise width. The first interconnect metal layer 106 will remain and will be slightly thicker because of the layer of fuse metal overlying the same. As can be seen from the isometric view shown in FIG. 8, a fuse element 108 is provided which has a precise width and a precise thickness so that it will be blown or fused with a predetermined current in the manner hereinbefore described with the first embodiment. The fuse element is provided with contact portions 108a as shown.

After the fuse pattern has been formed, a layer of glass 109 is provided. The glass layer 109 is preferably doped with an impurity such as phosphorus to prevent cracking of the glass when thick metal layers are utilized under the glass as in the present embodiment. The glass can have any suitable thickness as, for example, a thickness of 10,000 A°.

After the glass layer 109 has been deposited, openings 111, 112, and 113 are formed in the glass by the utilization of a suitable etch. After the openings have been formed, a layer of suitable metal such as aluminum is evaporated over the exposed surface and into the openings 111, 112 and 113. Thereafter, by the use of suitable photolithographic techniques, the undesired metal is removed to provide a base 114 which makes contact with the contact portion 108*a* of the fuse element. A lead 115 makes contact with the other end portion 108*a* of the fuse element and lead 116 makes contact with the first metal layer and the base of the transistor. A similar lead can be provided for the collector contact (not shown).

with the foregoing method it can be seen that there has been provided dual layer metallization which can be utilized for interconnecting the devices while still at the same time retaining the novel fuse construction of the present invention. There is only one additional step - the evaporation of the fuse metal.

The utilization of the two-layer metallization makes it possible to avoid resistance drops of the type hereinbefore described in conjunction with the previous embodiment.

It should be appreciated that although in both of the embodiments junction isolation has been utilized for providing isolated regions 47, dielectric isolation can be utilized if desired.

The semiconductor structure with fusible link is usable in many different integrated circuits. It is particularly useful in the more complicated circuits as, for example, read only memories. For example, it has been found to be particularly useful with 100 bit read only memories and 256 bit programmable read only memories. In these embodiments, every bit was connected by a fuse link so that the entire circuit will read 1's or 0's, whichever is decided upon in the coding. A customer who has purchased an intergrated circuit can selectively code such a read only memory. The customer, by utilizing a decoding impulse, will select the particular bit to be fused and by raising the output to a higher voltage, a high enough current will be produced to instantaneously fuse that particular fuse element or link. By picking out the bits needed to code a particular memory pattern, it is possible to create a unique read only memory in the field which can be utilized immediately.

When a fusing current is supplied through the fuse, a clean break is provided with no possibility of rejoining because there is no metal over the brake. The glass which is provided and which overlies the fuse absorbs substantially all the aluminum by conversion to aluminum oxide.

It is apparent from the foregoing that there has been provided a semiconductor structure with fusible link and method which has many advantages. The fusible link is formed in such a manner that it will blow or fuse at a precise current which is substantially below that which will cause migration of the aluminum when it is used as the fuse material. The fuse is constructed in such a manner that it does not add unduly to the complexity of the integrated circuit in which it is provided. The fusing current is less than 500 milliamperes. The fusible links can readily carry 2 milliamperes continuously. In addition, the fusing current for the fusible links is very uniform. This permits the customer to program an array with its own functions and to change the function of the array at will.

I claim:

1. In a method for forming an array in a semiconductor structure, providing a semiconductor body having a planar surface, forming a plurality of semiconductor devices in the semiconductor body having areas extending to said surface, forming a layer of insulating material on said surface, forming a plurality of spaced separate fusible links on planar portions of the layer of insulating material with each of the fusible links having a portion which is relatively precise and uniform in thickness and width throughout its length so that it can be fused with a relatively precise current level flowing through the same, forming additional layer of insulating material over said first named layer of insulating material, said fusible links and said devices, forming contact openings remote from said precise portions and extending through at least said additional layer of insulating material, forming a lead structure on said additional layer of insulating material extending through said contact openings to establish electrical conducting paths between said fusible links and said devices so that said fusible links are in series with said devices, supplying current to said lead structure for selectively blowing certain of said fusible links to provide the desired array, said current being of a level which is insufficient to harm the semiconductor devices connected to the fusible links but being sufficient to cause said fusible links to blow.

2. A method as in claim 1 wherein said fusible links are formed by depositing a metal of the desired thickness onto the first named layer of insulating material.

3. A method as in claim 1 wherein said fusible links are formed by depositing metal of greater than the desired thickness upon the first named layer of insulating material and then removing a portion of the deposited metal to provide a layer of the desired thickness.

4. A method as in claim 1 wherein the additional layer of insulating material serves to absorb a substantial portion of the metal particles from the fusible links when they are blown.

* * * * *